United States Patent
Kang et al.

(10) Patent No.: US 9,257,340 B2
(45) Date of Patent: Feb. 9, 2016

(54) WAFER AND METHOD FOR FORMING THE SAME

(71) Applicant: SK HYNIX INC., Icheon (KR)

(72) Inventors: Hee Bok Kang, Cheongju (KR); Young Wug Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/273,468

(22) Filed: May 8, 2014

(65) Prior Publication Data

US 2014/0242758 A1     Aug. 28, 2014

Related U.S. Application Data

(62) Division of application No. 12/792,489, filed on Jun. 2, 2010, now abandoned.

(30) Foreign Application Priority Data

Nov. 27, 2009 (KR) .................. 10-2009-0115594

(51) Int. Cl.
*H01L 21/78*     (2006.01)

(52) U.S. Cl.
CPC ..................... *H01L 21/78* (2013.01)

(58) Field of Classification Search
CPC .................. H01L 21/78; H01L 23/544
See application file for complete search history.

(56) References Cited

U.S. PATENT DOCUMENTS

| 6,071,656 | A | 6/2000 | Lin |
| 2003/0102526 | A1 | 6/2003 | Dias et al. |
| 2005/0282360 | A1 | 12/2005 | Kinda et al. |
| 2007/0023932 | A1 | 2/2007 | Sogawa et al. |

FOREIGN PATENT DOCUMENTS

| CN | 1599955 A | 3/2005 |
| CN | 1713354 A | 12/2005 |
| KR | 10-2004-0034484 A | 4/2004 |
| KR | 10-2009-0107511 A | 10/2009 |

*Primary Examiner* — Matthew Reames

(57) ABSTRACT

A wafer and a method for forming the same are disclosed. The wafer forming method can separate respective chips from others by performing a Deep Reactive Ion Etching (DRIE) process on a wafer including a plurality of chips. The wafer includes a plurality of chips configured to be arranged in row and column directions on the wafer, a scribe line configured to be formed among the plurality of chips so as to separate each chip, and an align key line configured to be formed in one side of the wafer so as to form an align key pattern.

21 Claims, 18 Drawing Sheets

WAFER AND METHOD FOR FORMING THE SAME

CROSS-REFERENCE TO RELATED APPLICATION

The present application is a divisional of U.S. patent application Ser. No. 12/792,489, filed on Jun. 2, 2010, which claims priority of Korean Patent Application No. 10-2009-0115594 filed on Nov. 27, 2009, which are incorporated by reference in their entirety.

BACKGROUND OF THE INVENTION

Embodiments of the present invention relate to a wafer and a method for forming the same, and more specifically, to a technology for separating each chip from a wafer including a plurality of chips.

A radio frequency identification (RFID) tag chip has been widely used to automatically identify objects using a radio frequency (RF) signal. In order to automatically identify an object using the RFID tag chip, an RFID tag is first attached to the object to be identified, and an RFID reader wirelessly communicates with the RFID tag of the object in such a manner that a non-contact automatic identification scheme is implemented. With the widespread use of RFID technologies, the shortcomings of related automatic identification technologies, such as barcode and optical character recognition technologies have been greatly reduced.

In recent times, the RFID tag has been widely used in physical distribution management systems, user authentication systems, electronic money (e-money), transportation systems, and the like.

For example, a physical distribution management system generally performs classification of goods or management of goods in stock using an Integrated Circuit (IC) recording data therein, instead of using a delivery note or tag. In addition, a user authentication system generally performs an Entrance and Exit Management function or the like using an IC card including personal information or the like.

In the meantime, a non-volatile ferroelectric memory may be used as a memory in an RFID tag.

Generally, a non-volatile ferroelectric memory, (i.e., a Ferroelectric Random Access Memory (FeRAM)) has a data processing speed similar to that of a Dynamic Random Access Memory (DRAM), and preserves data even when power is turned off, and thus many developers are conducting intensive research on FeRAM as a next generation memory device.

The above-mentioned FeRAM has a very similar structure to that of DRAM, and uses a ferroelectric capacitor as a memory device. The ferroelectric substance has high residual polarization characteristics such that data is not lost although an electric field is removed.

A RFID device uses frequencies of various bands. In general, as a frequency band is decreased, the RFID device has a lower recognition speed, is operated at a shorter distance, and is less affected by the surrounding environment. In contrast, as a frequency band is increased, the RFID device has a higher recognition speed, is operable at a relatively longer distance, and is more susceptible to the surrounding environment.

A plurality of RFID chips are included in a wafer. The RFID chips are arranged in rows and columns. In order to perform dicing of each RFID chip at a wafer level, laser sawing may be used.

In addition, mask align keys, are formed on a scribe line of a wafer. The mask align keys are used as a reference for separating individual RFID chips from one another. In other words, the scribe line is cut by a laser beam such that individual RFID chips can be separated from one another. The cutting process requires much time and thus increases production costs.

Also, since a conventional RFID device needs to have a mask align key on a scribe line, a relatively large interval should be secured between chips. In other words, one scribe line for separating each chip and another scribe line for align keys are widely arranged at a given interval among chips. As a result, the number of net dies per wafer is decreased.

BRIEF SUMMARY OF THE INVENTION

Various embodiments of the present invention are directed to providing a wafer and a method for forming the same that substantially obviate one or more problems due to limitations and disadvantages of the related art.

An embodiment of the present invention relates to a wafer technology for allowing each memory chip to be diced using a Deep Reactive Ion Etching (DRIE) process without performing an additional sawing process on a wafer including a plurality of memory chips.

An embodiment of the present invention relates to a wafer technology for allowing each RFID chip to be diced using a DRIE process without performing an additional sawing process on a wafer including a plurality of memory chips.

An embodiment of the present invention relates to a wafer technology for reducing an area of a scribe line which is used to separate each chip from a wafer.

An embodiment of the present invention relates to a wafer technology which distinguishes a scribe line for separating each chip from an align key line for arranging an align key and differently arranges the scribe line and the align key line, such that a scribe-line area can be reduced.

An embodiment of the present invention relates to a wafer technology for simultaneously performing a DRIE process on an overall wafer, such that fabrication time and costs requisite for dicing a wafer can be greatly reduced.

In accordance with one embodiment of the present invention, a wafer includes a plurality of chips configured to be arranged in row and column directions on the wafer; a scribe line configured to be formed among the plurality of chips so as to separate each chip; and an align key line configured to be formed in one side of the wafer so as to form an align key pattern.

In accordance with another aspect of the present invention, a method for forming a wafer which includes a chip area, a scribe line for isolating the chip area, and an align key line in which an align key pattern is formed includes forming the align key pattern on the align key line of a semiconductor substrate; forming a circuit area on the chip area located at an upper part of the semiconductor substrate; forming a passivation layer on the circuit area; exposing the align key pattern by performing a backgrinding process at a back side of the semiconductor substrate; forming a first trench on the semiconductor substrate formed in the scribe line, using a photoresist pattern as an etch mask; and performing a wafer mounting process on the semiconductor substrate including the first trench.

In accordance with another aspect of the present invention, a method for forming a wafer which includes a chip area, a scribe line for isolating the chip area, and an align key line in which an align key pattern is formed includes forming a circuit area on the chip area located at an upper part of a semiconductor substrate; forming the align key pattern on the align key line of a semiconductor substrate; forming a passivation layer on the circuit area; exposing the align key pattern by performing a backgrinding process at a back side of the semiconductor substrate; forming a first trench on the semiconductor substrate formed in the scribe line, using a photoresist pattern as an etch mask; and performing a wafer mounting process on the semiconductor substrate including the first trench.

The above-mentioned embodiments of the present invention have the following characteristics.

First, a wafer and a method for forming the same according to one aspect of the present invention can allow each memory chip to be diced using a DRIE process without performing an additional sawing process on a wafer including a plurality of memory chips, resulting in reduction in fabrication time and costs.

Second, a wafer and a method for forming the same according to another aspect of the present invention can allow each RFID chip to be diced using a DRIE process without performing an additional sawing process on a wafer including a plurality of memory chips, resulting in reduction in fabrication time and costs.

Third, a wafer and a method for forming the same according to another aspect of the present invention can reduce an area of a scribe line which is used to separate each chip on a wafer, such that the number of net dies is increased Fourth, a wafer and a method for forming the same according to another aspect of the present invention can discriminate and differently arrange a scribe line for separating each chip and an align key line for arranging an align key, resulting in reduction in a scribe-line area.

Fifth, a wafer and a method for forming the same according to another aspect of the present invention can simultaneously perform a DRIE process on an overall wafer, such that fabrication time and costs requisite for wafer dicing can be greatly reduced.

It is to be understood that both the foregoing general description and the following detailed description of the present invention are exemplary and explanatory and are intended to provide further explanation of the invention as claimed.

It will be appreciated by persons skilled in the art that that the effects that can be achieved with the present invention are not limited to what has been particularly described hereinabove and other advantages of the present invention will be more clearly understood from the following detailed description taken in conjunction with the accompanying drawings.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
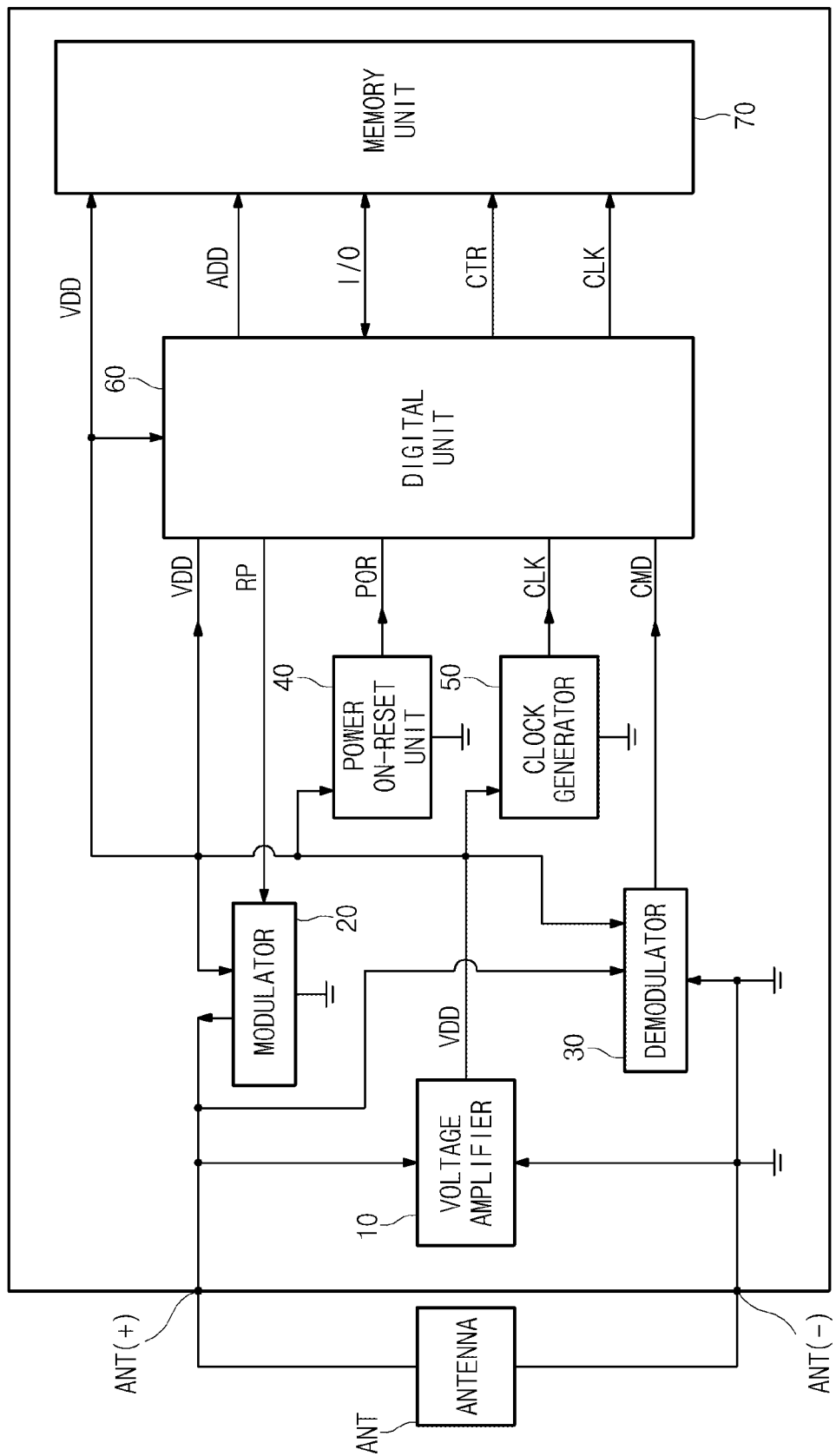
FIG. 1 is a block diagram illustrating a Radio Frequency Identification (RFID) chip according to an embodiment of the present invention.

FIG. 1 is a block diagram illustrating a Radio Frequency Identification (RFID) chip according to an embodiment of the present invention.

Referring to FIG. 1, the RFID chip includes an antenna ANT, a voltage amplifier 10, a modulator 20, a demodulator 30, a power-on reset unit 40, a clock generator 50, a digital unit 60, and a memory unit 70.

The antenna ANT receives a radio frequency (RF) signal from an RFID reader. The RF signal received in the RFID device is input to the RFID chip via antenna pads ANT(+) and ANT(−).

The voltage amplifier 10 rectifies and boosts the RF signal received via the antenna ANT, and generates a power-supply voltage VDD serving as an RFID-device driving voltage.

The modulator 20 modulates a response signal RP received from the digital unit 60, and outputs the modulated response signal RP to the antenna ANT. The demodulator 30 demodulates the RF signal received from the antenna ANT in response to the output voltage of the voltage amplifier 10, and outputs a command signal CMD to the digital unit 60.

The power-on reset unit 40 detects a power-supply voltage generated in the voltage amplifier 10, and outputs a power-on reset signal POR to the digital unit 60 so as to control a reset operation in response to the detected power-supply voltage. In this case, detailed operations of the power-on reset signal POR are as follows. The power-on reset signal POR increases simultaneously with a power-supply voltage during a time in which the power-supply voltage changes from a low level to a high level. When the power-on reset signal POR reaches the power-supply voltage VDD, the power-on reset signal POR is changed from a high level to a low level. The reset signal POR going high to low resets the RFID device.

The clock generator 50 outputs a clock signal CLK to the digital unit 60, wherein the clock signal CLK is capable of controlling operations of the digital unit 60 in response to the power-supply voltage VDD generated from the voltage amplifier 10.

The digital unit 60 receives a power-supply voltage VDD, a power-on reset signal POR, a clock signal CLK, and a command signal CMD, interprets the command signal CMD, and generates a control signal and process signals. The digital unit 60 outputs a response signal RP to the modulator 20 in response to the control signal and the process signals. The digital unit 60 outputs an address ADD, input/output data I/O, a control signal CTR, and a clock signal CLK to the memory unit 70.

The memory unit 70 includes a plurality of memory cells. Each memory cell reads and writes data in a storage unit.

The memory unit 70 may be a non-volatile ferroelectric memory (FeRAM). The FeRAM has a data processing speed and structure similar to that of a DRAM. Also, the FeRAM uses a ferroelectric material as a capacitor so that it has high residual polarization characteristics. Due to the high residual polarization characteristics, data is not lost even though power is removed.

Figure 2:
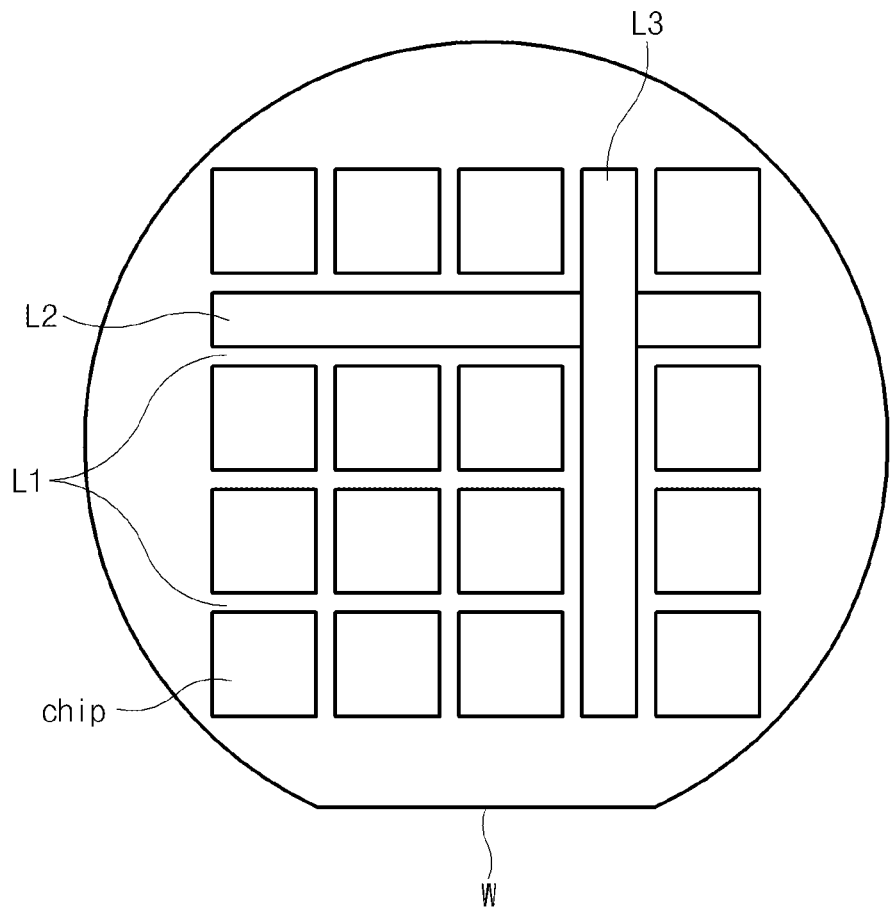
FIGS. 2 to 3 illustrate a method for forming a wafer according to an embodiment of the present invention.

FIG. 2 illustrates a method for forming a wafer according to an embodiment of the present invention.

Referring to FIG. 2, a wafer according to an embodiment of the present invention may include an RFID chip, a DRAM, a FeRAM, or other memory chip, etc. For convenience of description and better understanding of the present invention, it is assumed that a wafer W to be described in the following embodiments is comprised of RFID chips.

A plurality of RFID tag chip arrays are arranged on the wafer W in rows and columns. A scribe line (or scribe region)

L1 is arranged between RFID chips such that each chip to be separated and diced by a Deep Reactive Ion Etching (DRIE) process.

Align key lines L2 and L3 are formed on the wafer W so as to form a photo-mask align key. The align key lines L2 and L3 are arranged to cross each other on a scribe line. Align key lines (or align key region) L2 and L3 are formed in a line pattern in a horizontal and vertical direction, respectively. Align key element patterns are formed on align key lines L2 and L3.

The wafer according to the embodiment of the present invention includes one scribe line L1 for use in separating each chip and other scribe lines L2 and L3 for use in forming photo-mask align keys, resulting in a dual scribe line on the wafer.

The present invention employs a DRIE process which is applied onto a back side of a wafer to form a deep trench on the back side of the wafer. Individual chips are diced using these deep trench areas. In contrast, another embodiment of the present invention may apply a DRIE process onto a front side of a wafer to form a deep trench on the front side of the wafer. These deep trenches are then used to dice each chip.

In accordance with the above-mentioned wafer of the present invention, one scribe line L1 for separating each chip and other scribe lines L2 and L3 for forming a photo-mask align key are distinguished from each other, such that the scribe line l1 and the scribe lines L2 and L3 are separately arranged on a wafer. Therefore, a scribe-line area is reduced at a wafer level, such that the number of net dies is increased.

Figure 3:
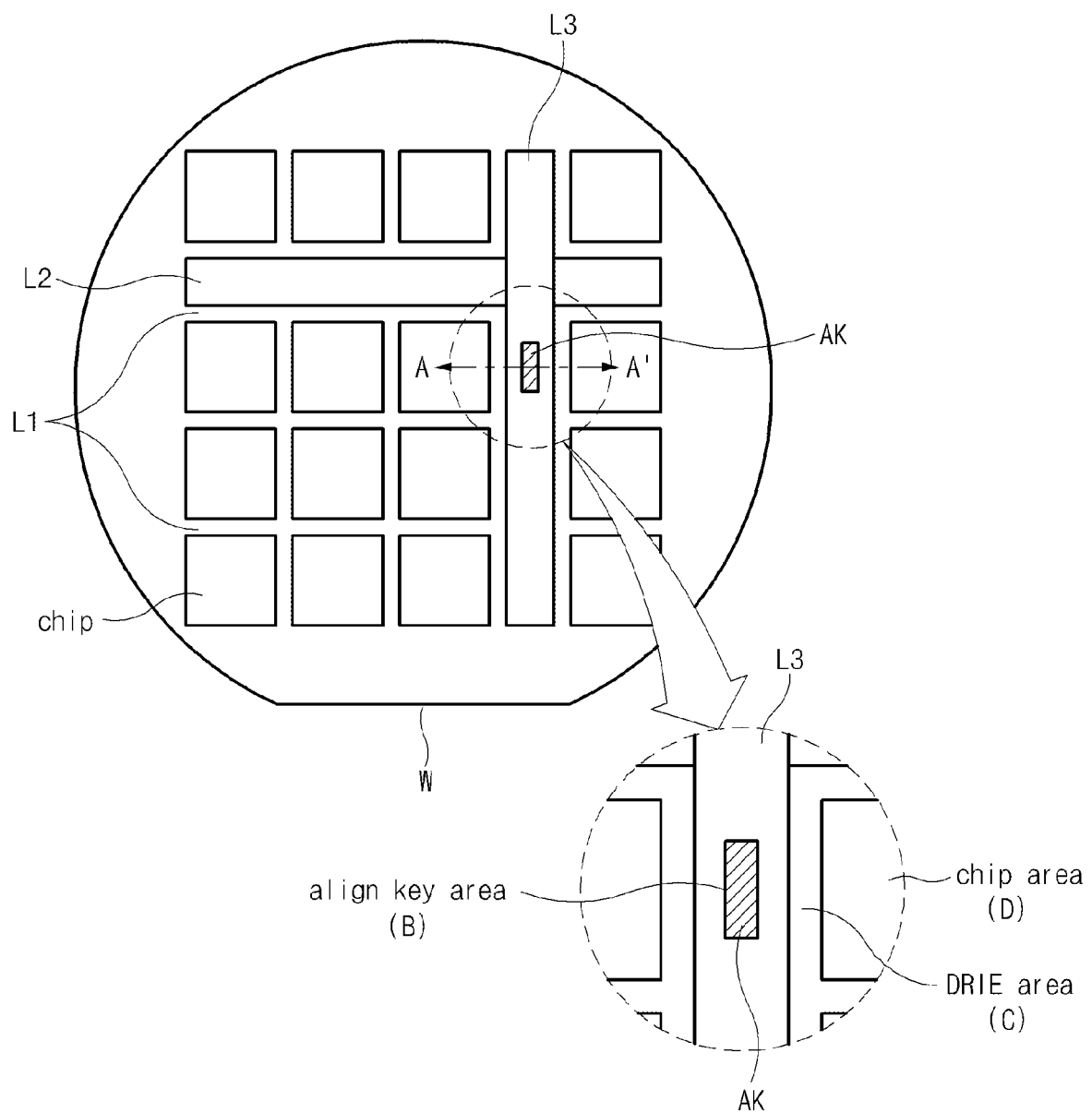

As shown in FIG. 3, an align key AK is formed in a predetermined area of an align key line L3. In this case, the align key AK may correspond to a DRIE mask align key area B for allowing a DRIE process to be performed at a back side of a wafer W. That is, the mask align key area B includes a mask align key AK, such that a DRIE area C can be mask-aligned after the execution of a backgrinding process. Hereinafter, the align-key line L2 or L3 where the align key AK is formed is referred to as align-key area B.

In addition, the scribe line L1 for use in separating each chip by a DRIE process is referred to as a DRIE area C. In the DRIE area C, a trench may be formed according to which DRIE process is performed. An area where a chip circuit is located is referred to as a chip area D.

FIGS. 4 to 15 are cross-sectional views illustrating a method for forming a wafer according to an embodiment of the present invention. In more detail, FIGS. 4 to 15 are cross-sectional views illustrating wafers taken along the line A-A' of FIG. 3. In accordance with an embodiment of the present invention, a substrate area of the wafer is largely divided into a mask align key area B, a DRIE area C, and a chip area D.

Figure 4:
FIGS. 4 to 15 are cross-sectional views illustrating a method for forming a wafer according to an embodiment of the present invention.

Referring to FIG. 4, a first trench 101 is formed over the align-key area B of the semiconductor substrate 100. The semiconductor substrate 100 can be formed of silicon (Si), germanium (Ge), or germanium arsenide (GeAs), but not limited thereto.

Figure 5:
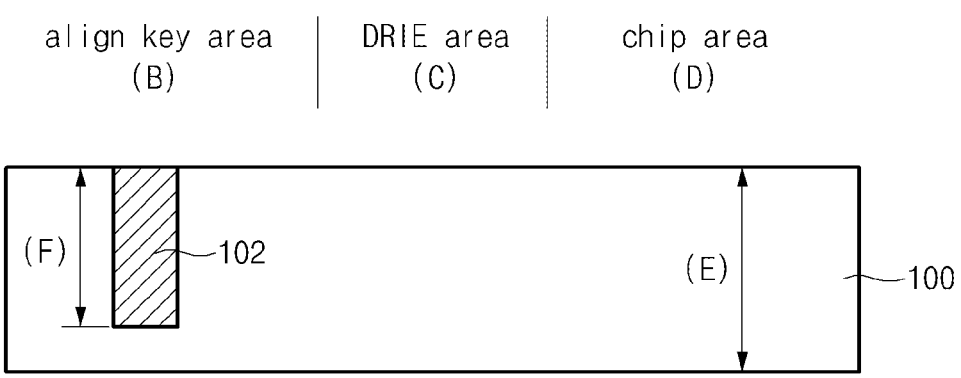

The first trench is used to form a mask align key pattern 102 as shown in FIG. 5. The mask align-key pattern 102 is used in a mask process during a back-grinding process prior to a Complementary Metal-Oxide-Semiconductor (CMOS) process.

Since the mask align key is exposed during the back-grinding process, a wafer forming method according to an embodiment of the present invention is performed with a dual scribe line photo-mask process using the exposed back-grinding align key. A back side and a front side of the wafer can be aligned in this manner.

Thereafter, as shown in FIG. 5, a filling material 102 is used which fills up the first trench 101. The filling material 102 may be formed of a material with a color different from that of a semiconductor substrate 100. Different colors can make the align-key pattern 102 stand out from the semiconductor substrate 100 during the dual scribe line photo-mask process.

It is preferable that the filling material 102 be formed of a tungsten (W) based metal layer, a silicon oxide (SiO2) based oxide layer, or a nitride layer but not limited thereto.

If the semiconductor substrate 100 has a thickness E of about 750 μm, it is preferable that a depth of the first trench 101 is set to about 500 μm~750 μm. However, the thickness of the semiconductor substrate 100 is not limited thereto, but may vary as necessary. As the wafer size is gradually increased, the semiconductor substrate 100 becomes thicker. Accordingly, the thickness of the semiconductor substrate 100 may be about 600 μm, 550 μm, and the like.

The first trench 101 is deeply etched from the surface of the semiconductor substrate 100. The first trench 101 may penetrate the semiconductor substrate 100 to form a hole.

Figure 6:
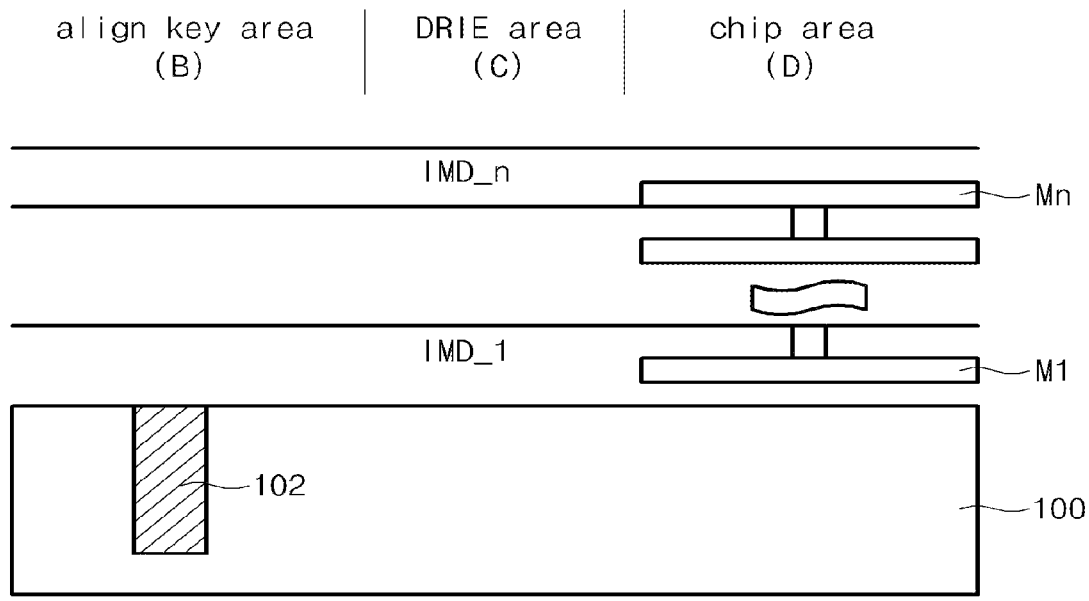

Subsequently, as shown in FIG. 6, a CMOS circuit is formed on the semiconductor substrate 100. The CMOS circuit is formed in the chip area D.

Several metal lines M1~Mn and Inter Metal Dielectric (IMD) layers IMD_1~IMD_n are formed in the chip area D to form the CMOS circuit.

Although the embodiment of FIG. 6 has disclosed that the CMOS circuit is formed only in the chip area D, the scope and spirit of the present invention are not limited only thereto. As an example, the metal lines M1~Mn forming the CMOS circuit may be extended to the DRIE area C, and the DRIE area C may be formed of oxide material.

Figure 7:
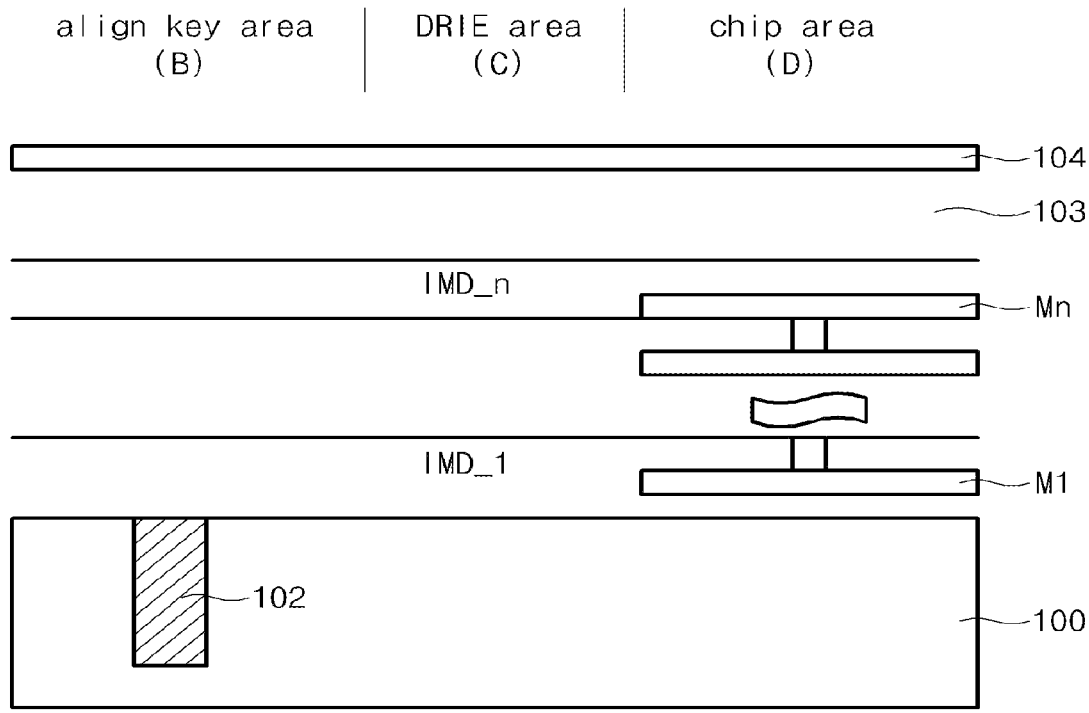

Next, as shown in FIG. 7, a passivation layer 103 is formed over the mask align key area B, the DRIE area C and the chip area D. Without the passivation layer 103, if the wafer is turned over for a subsequent process, the CMOS circuit may have direct contact with supporting means and the exposed metal lines M1~Mn may be damaged. In order to protect the metal lines M1~Mn from damage, the passivation layer 103 is formed. It is preferable that the passivation layer 103 be formed of a nitride material or a Polymide Isoindro Quirazorindione (PIQ) material.

After an entire circuit integration process is completed, the passivation layer 103 for protecting the chip is formed.

In addition, a coating film 104 is deposited over the passivation layer 103. The coating film 104 is formed to protect circuits on the front side of the wafer.

Figure 8:
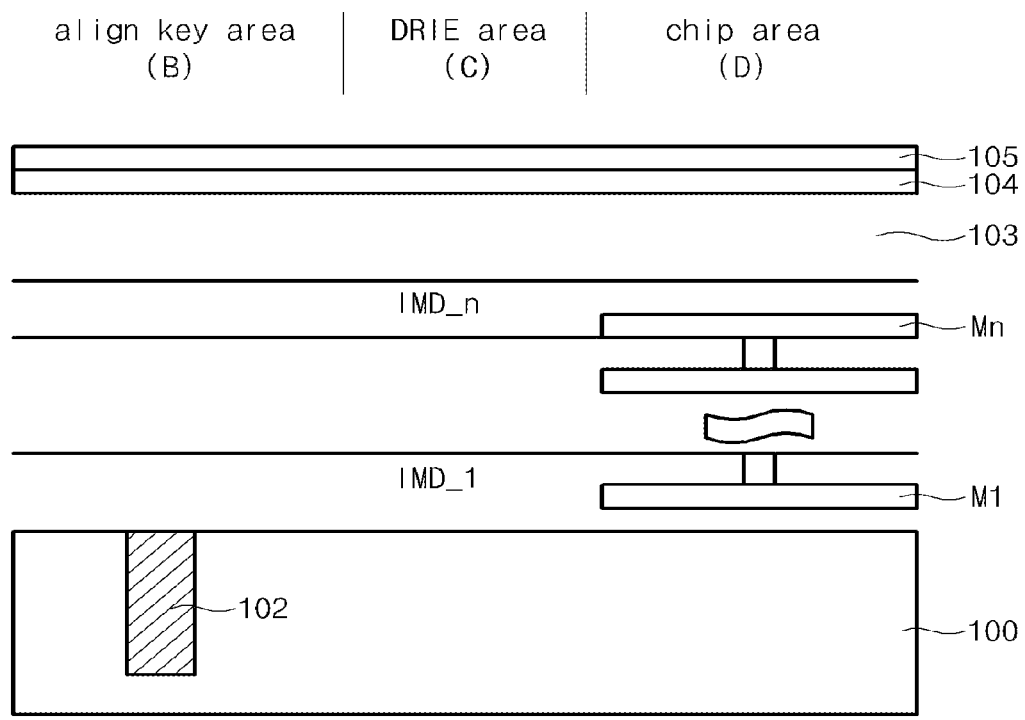

Thereafter, as shown in FIG. 8, a reinforcing film 105 is deposited on the coating film 104. In this case, the reinforcing film 105 serves as a physical support for protecting the wafer from an external physical stress. As a result, although the wafer receives a physical stress from the outside, the reinforcing film 105 prevents the wafer from being curved.

In more detail, in order to prevent wafer warpage encountered in the wafer back-grinding process, the reinforcing film 105 is additionally formed on the coating film 104.

The reinforcing film 105 may be formed of a polymer layer, an aluminum foil tape, or the like.

Figure 9:
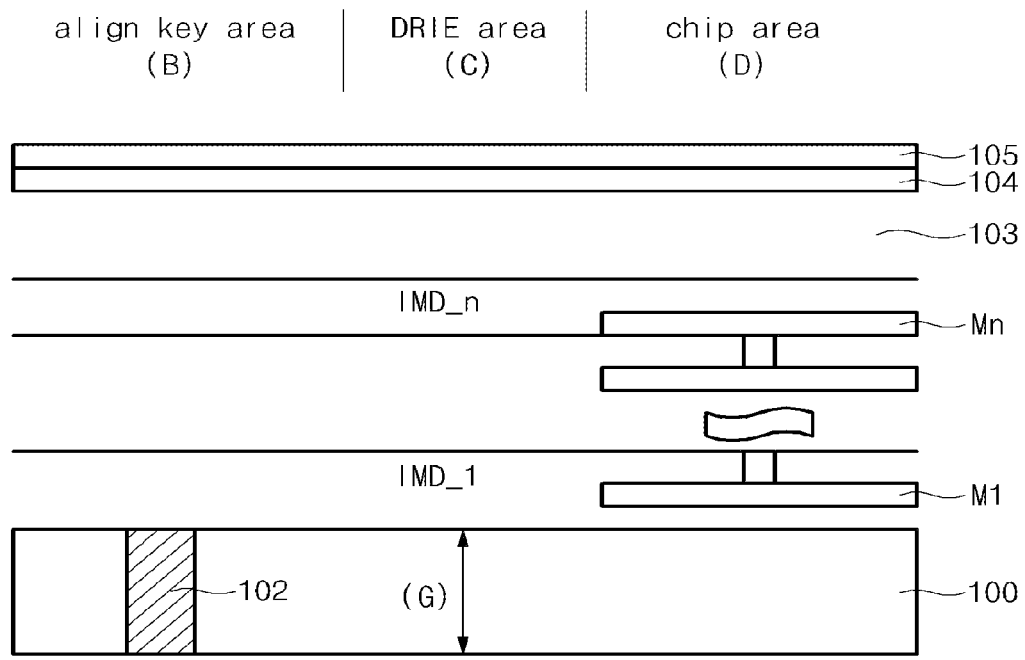

Next, the wafer is turned over as shown in FIG. 9, and a back-grinding process is performed on the back side of the semiconductor substrate 100. In this case, the grinding process is performed until the align-key pattern 102 is exposed.

For example, the semiconductor substrate 100 may be etched to have a thickness of about 200 μm~300 μm. The semiconductor substrate 100 after completion of the back-grinding process may also have a thickness of about 150 μm. However, the thickness of the semiconductor substrate 100 after the back-grinding process is not limited thereto. The thickness of the semiconductor substrate 100 can be adjusted as necessary as long as the align-key pattern 102 is exposed.

Figure 10:
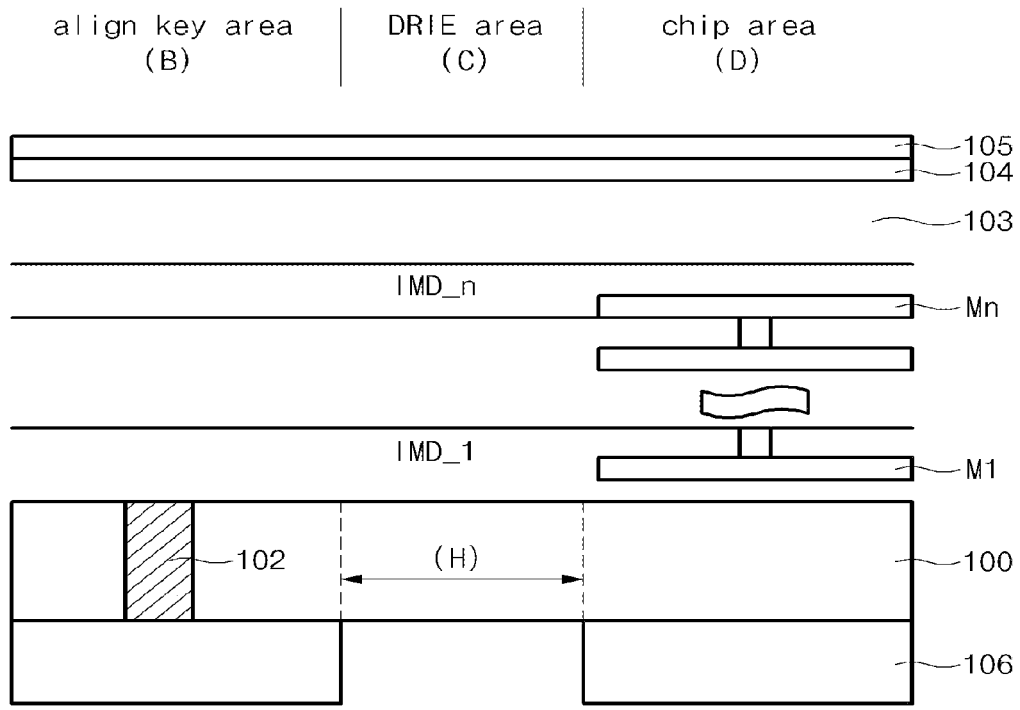

Subsequently, as shown in FIG. 10, a photoresist pattern 106 exposing the DRIE area C is formed on the back side of the semiconductor substrate 100. A second trench (or scribe trench) 107 is formed by etching the back side of the semiconductor substrate 100 using the photo resist pattern 106 as a mask.

The photoresist process is performed with the semiconductor substrate 100 turned over. Since the align-key pattern 102 is exposed on the back side of the semiconductor substrate 100, the align-key pattern 102 is used as a reference key for forming the second trench 107.

The photoresist pattern 106 is formed by covering the align-key area B and the chip area D, but exposing the DRIE area C. The align key pattern 102 may be used as a reference key for etching the DRIE area C (i.e., H area).

Figure 11:
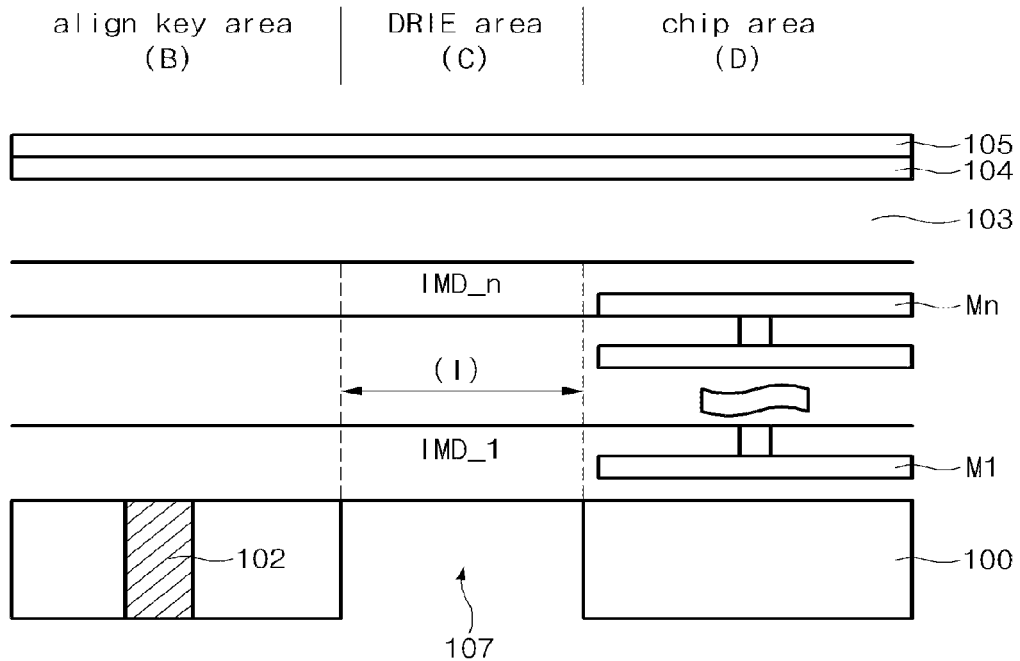

Thereafter, as shown in FIG. 11, the DRIE process is executed on the back side of the wafer such that the second trench 107 for wafer dicing is formed on the wafer. The H area is etched such that the second trench 107 for forming the scribe line L1 is formed.

In accordance with the embodiment of the present invention, the second trench 107 is formed by etching the H area. However, the scope or spirit of the present invention is not limited thereto, and the etching range of the DRIE area C may be extended to a width I so as to include a part of the align key are B or the chip area D.

Figure 12:
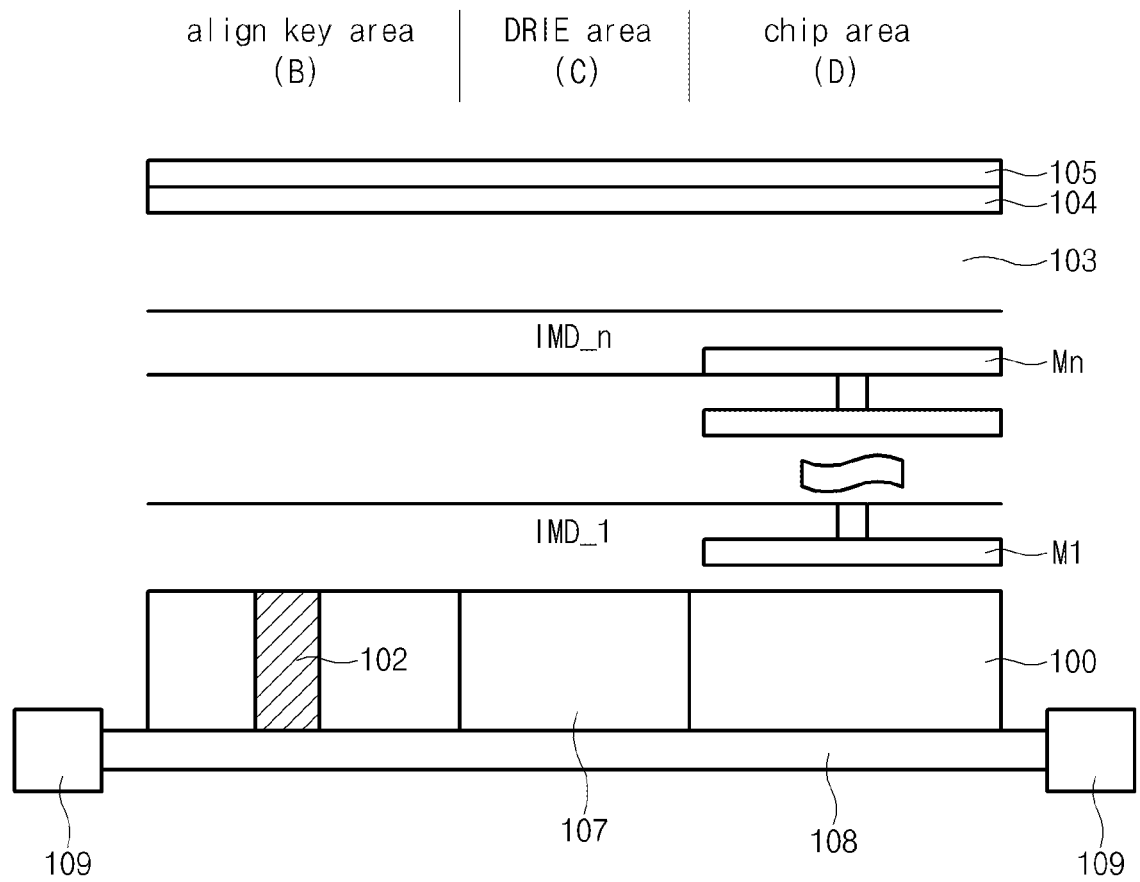

Next, as shown in FIG. 12, a ring film 108 is formed over the back side of the semiconductor substrate 100. A ring mount 109 is then formed at both sides of the ring film 108 in a cross-sectional structure.

The ring film 108 is used as a protection film such that it protects chips contained in the wafer while the wafer is delivered, or protects the second trench 107 from any probable change during a packaging process. For this operation, the ring film 108 is detachably mounted over the semiconductor substrate 100 so that the ring film 108 can be easily removed from the semiconductor substrate 100 if required.

Figure 13:
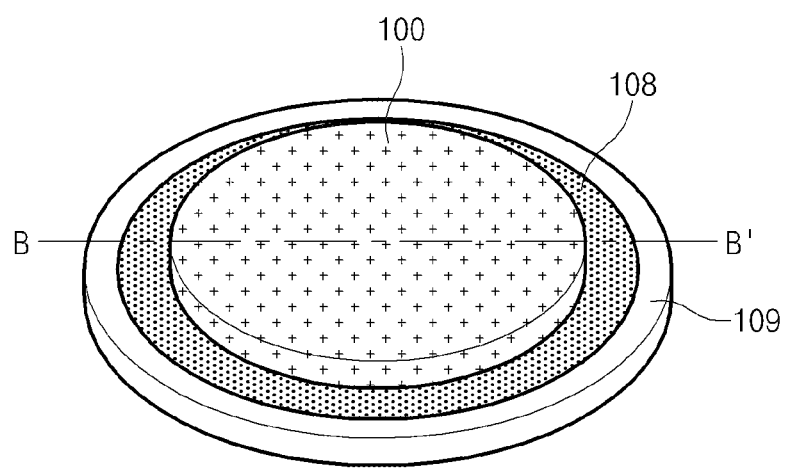

FIG. 13 is a perspective view illustrating the semiconductor substrate 100, the ring film 108 and the ring mount 109. FIG. 12 is a cross-sectional view taken along the line B-B' of FIG. 13.

Referring to FIG. 13, a wafer ring frame is formed on the back side of the semiconductor substrate 100 and the wafer ring frame includes a donut-ring-shaped ring mount 109 and a ring film 108 mounted on the semiconductor substrate 100.

That is, the ring mount 109 for supporting the ring film 108 is formed in the vicinity of the outline of the ring film 108. In addition, the semiconductor substrate 100 including the trench area 107 is formed on the ring film 108. the back side of the semiconductor substrate 100 may be in contact with the ring film 108.

Figure 14:
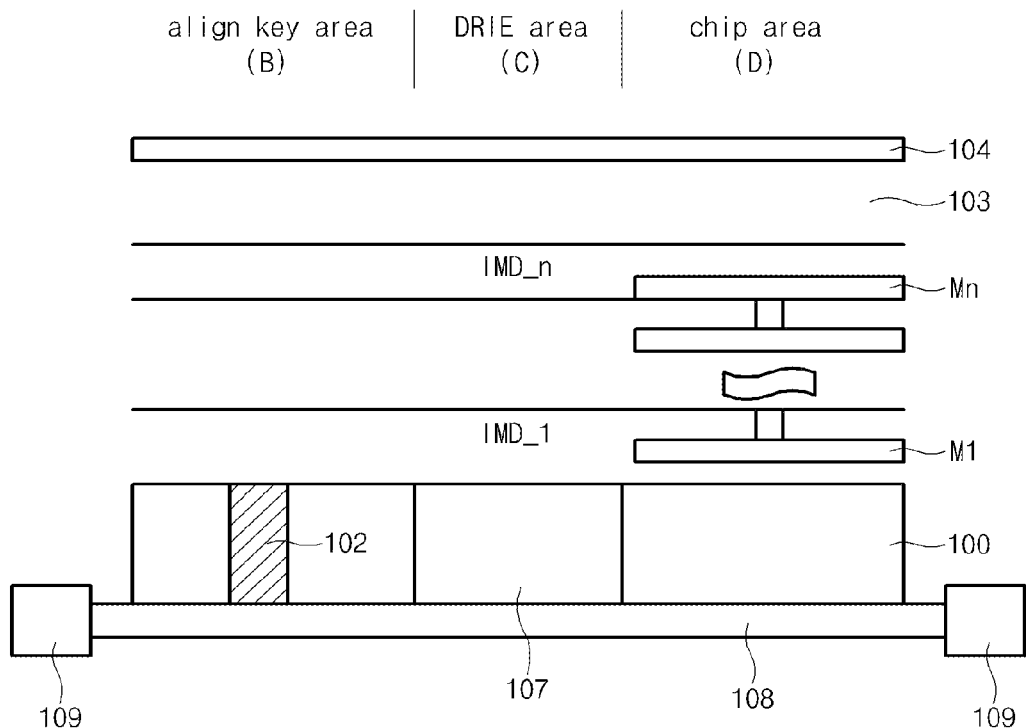
Figure 15:
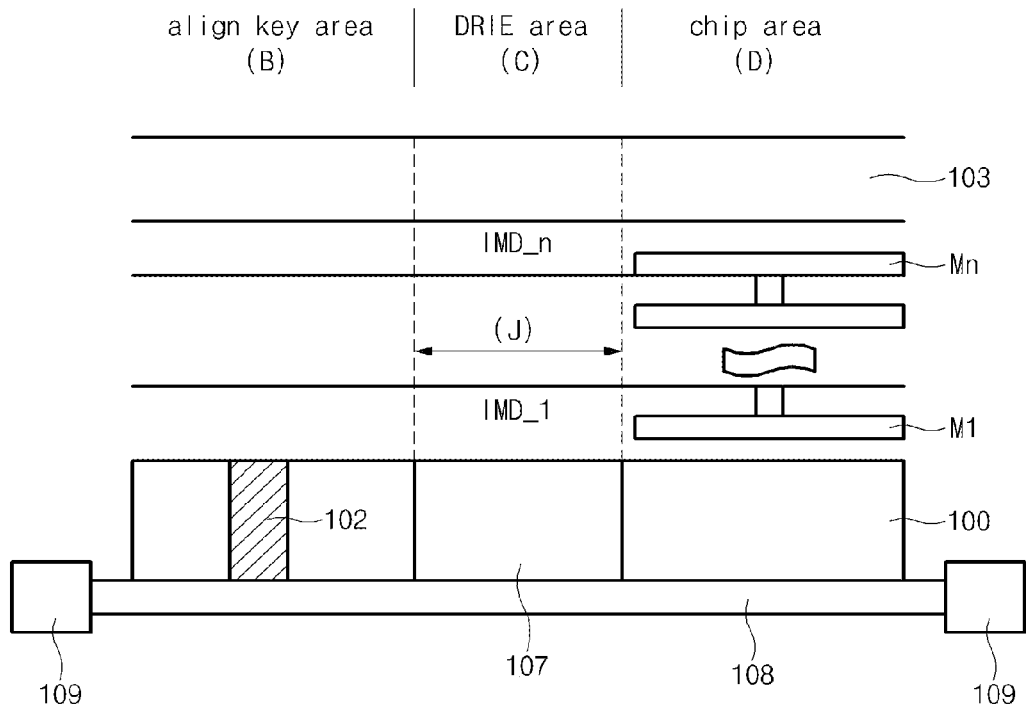

Thereafter, as shown in FIG. 14, the wafer is turned over again so that the front side of the wafer faces up, and the outermost reinforcing film 105 is removed. Then, as shown in FIG. 15, the coating film 104 formed on the passivation layer 103 is removed. Therefore, the wafer forming method according to the embodiment of the present invention performs the DRIE dicing process without performing an additional wafer sawing process.

The DRIE area C a specific area J is formed is significantly thinner than the semiconductor substrate 100 such that the J area has a very thin thickness (i.e., a very small depth) as compared to the semiconductor substrate 100. In particular, the J area having a small thickness is considered in the same manner as in an etched status, such that it can be easily isolated. The DRID area C is thin enough to be cut by a DRIE process rather than a sawing process.

For example, if it is assumed that the semiconductor substrate 100 has a thickness of about 200 μm~300 μm, the J area may be configured to have a thickness of only about 3 μm. Since over 90% of the semiconductor substrate 100 has already been removed by the second trench 107, such that the J area can be easily isolated to make a distinction between chip areas.

When the scribe line L1 is cut along the second trench 107, the mask align key area B and the chip area D are separated from each other.

FIGS. 16 to 28 illustrate another embodiment of the present invention. In more detail, FIGS. 16 to 28 are cross-sectional views taken along the line A-A' of FIG. 3. In accordance with the embodiment shown in FIGS. 16 to 28, a CMOS circuit is first formed in a chip area of the semiconductor substrate.

In accordance with the embodiment of the present invention, a substrate is largely divided into a mask align key area B, a DRIE area C, and a chip area D.

Figure 16:
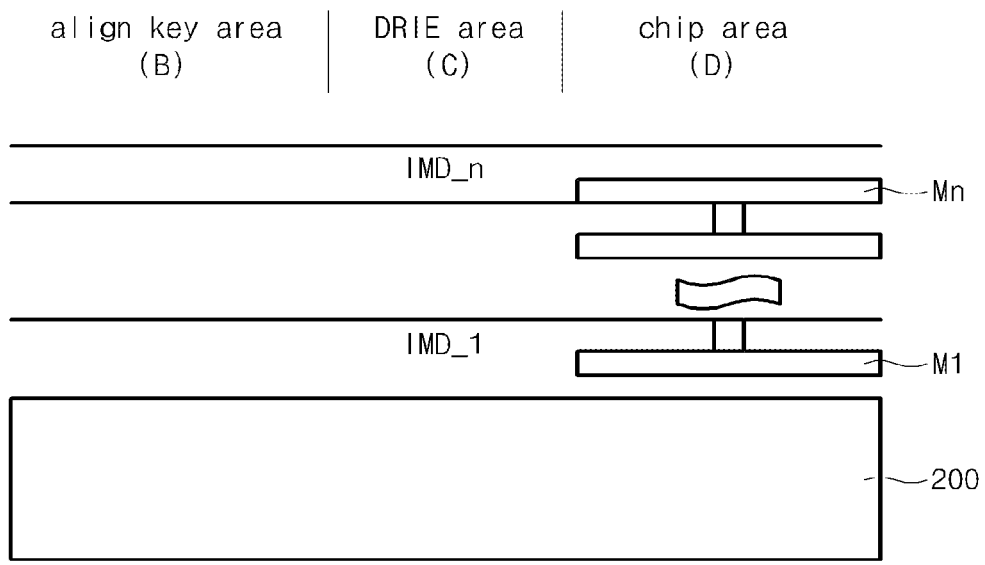
FIGS. 16 to 28 illustrate other embodiments of the present invention.

Referring to FIG. 16, the CMOS circuit is formed in the chip area D. It is preferable that the semiconductor substrate 200 is formed of silicon (Si), germanium (Ge), or germanium arsenide (GeAs), but not limited thereto.

Several metal lines M1~Mn are sequentially deposited and IMD layers IMD_1~IMD_n are formed in the chip area D.

Although the embodiment shown in FIG. 16 discloses that the CMOS circuit is formed only in the chip area D, the scope and spirit of the present invention are not limited only thereto. As an example, the metal lines M1~Mn forming the CMOS circuit may be formed extending to the DRIE area C.

Figure 17:
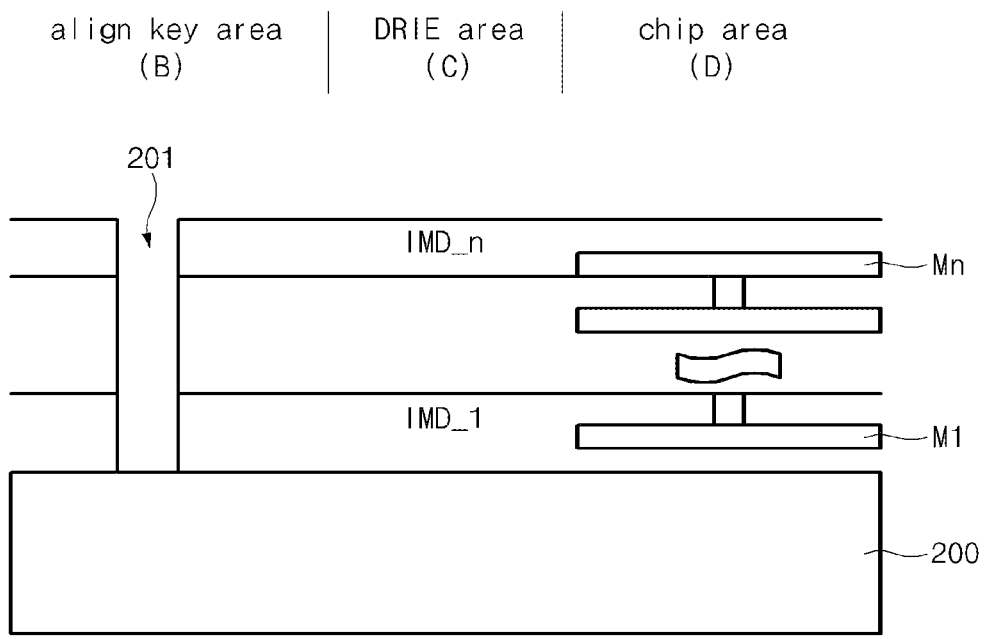

As shown in FIG. 17, Inter Metal Dielectric (IMD) layers IMD_1~IMD_n in the align key area B are patterned to expose the semiconductor substrate 200. As a result, a trench 201 is formed.

Figure 18:
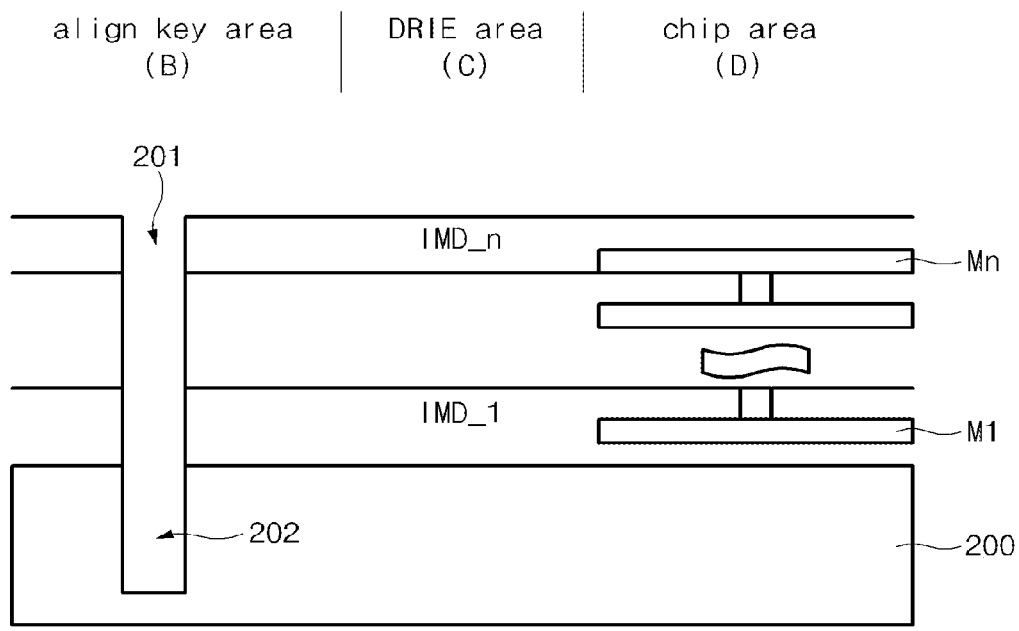

Subsequently, as shown in FIG. 18, the align key pattern is formed such that the backgrinding process can be performed in the align key area B of the semiconductor substrate 200. In other words, the trench area 202 in which the align key pattern is to be formed on the semiconductor substrate 200 exposed by the trench 201 is etched at the front side of the wafer by a given depth as represented by the reference numeral 202 to form a first trench (201, 202).

In order to process the photo-mask align key pattern when a mask process is performed during the backgrinding process, a process for etching a backgrinding align key trench is performed prior to a CMOS process. Then, an align-key pattern 203 is formed as shown in FIG. 19.

In other words, if the backgrinding align key is exposed during the backgrinding process, the wafer forming method according to the embodiment of the present invention performs a dual scribe line photo-mask process using the exposed backgrinding align key, such that alignment between the back side and the front side of the wafer can be adjusted. According to the embodiment of the present invention, since the align-key pattern 203 is exposed not only to the front side but also to the back side of the substrate 200, the align-key pattern 203 can serve as a align key not only for a photo masking process onto the front side of the substrate 200, but also for another photo masking process onto the back side of the substrate 200. The align-key pattern 203 makes possible for the present invention to employ a dual scribe line photo-mask process onto both of the front and the back sides of the substrate 200.

Figure 19:
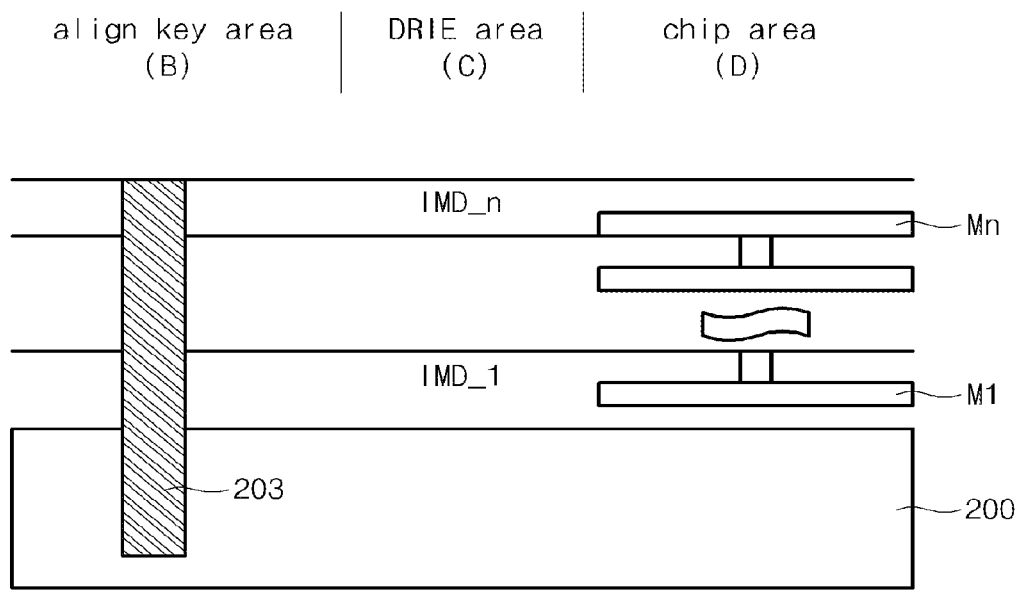

As shown in FIG. 19, a filling material is used to fill up the first trench (201 and 202) to form the align-key pattern 203.

The filling material 203 may be formed of material with a color different from that of the semiconductor substrate 200. As a result, the align-key pattern 203 can be easily discerned from the semiconductor substrate 200 at the dual scribe line photo-mask process.

It is preferable that the filling material is formed of a tungsten (W) based metal layer, a silicon oxide (SiO2) based oxide layer, a nitride layer, or the like but is not limited thereto.

The first trench (201 and 202) can be formed to penetrate the semiconductor substrate 200.

Figure 20:
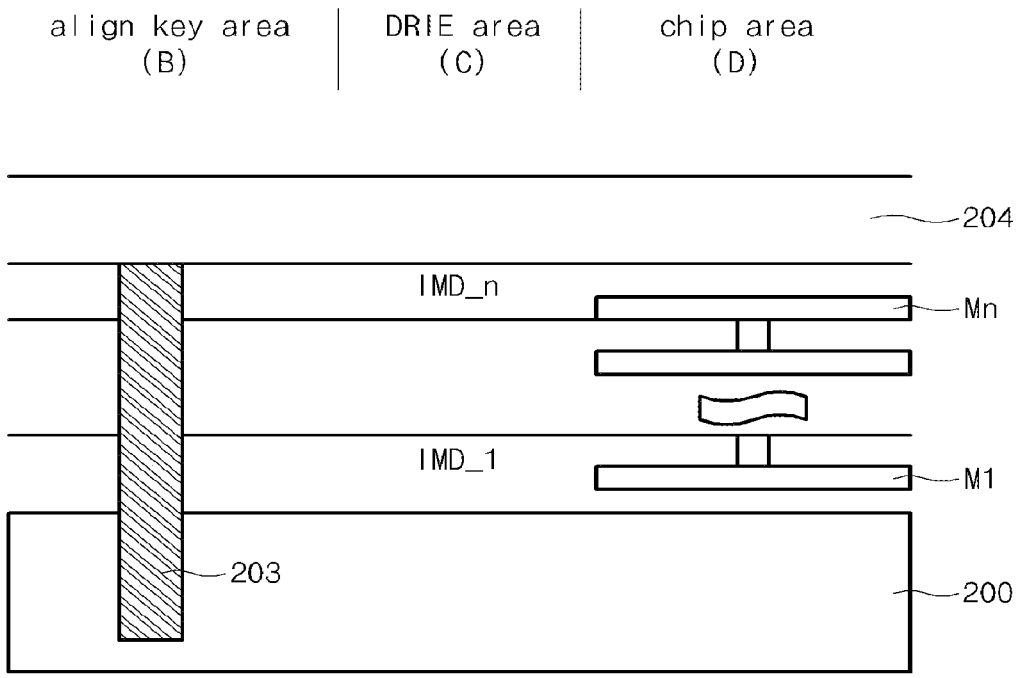

Next, as shown in FIG. 20, a passivation layer 204 is formed over the mask align key area B, the DRIE area C and the chip area D. If the wafer is turned over, the CMOS circuit may make contact with an external material and metal lines M1~Mn may be damaged thereby. In order to protect the metal lines M1~Mn from damage, a passivation layer 204 is formed. It is preferable that the passivation layer 204 be formed of a nitride material or a Polymide Isoindro Quirazorindione (PIQ) material.

When a chip integration process is completed, the passivation layer 204 for protecting the chip is formed.

Figure 21:
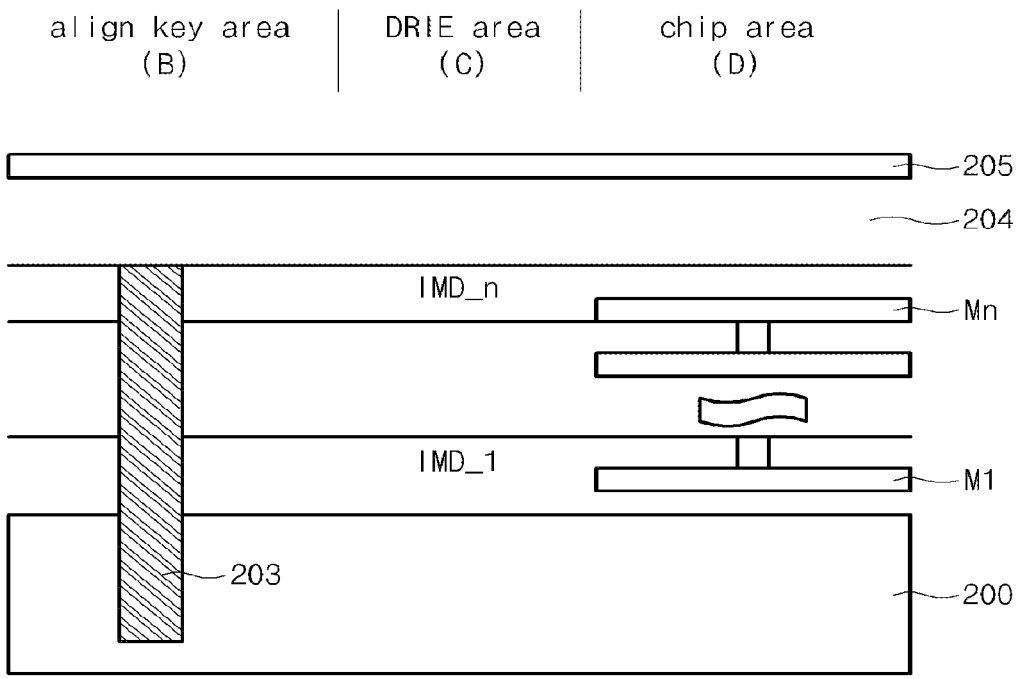

Subsequently, as shown in FIG. 21, a coating film 205 is deposited on the passivation layer 204. The coating film 205 is formed to protect circuits formed on the front side of the wafer.

Figure 22:
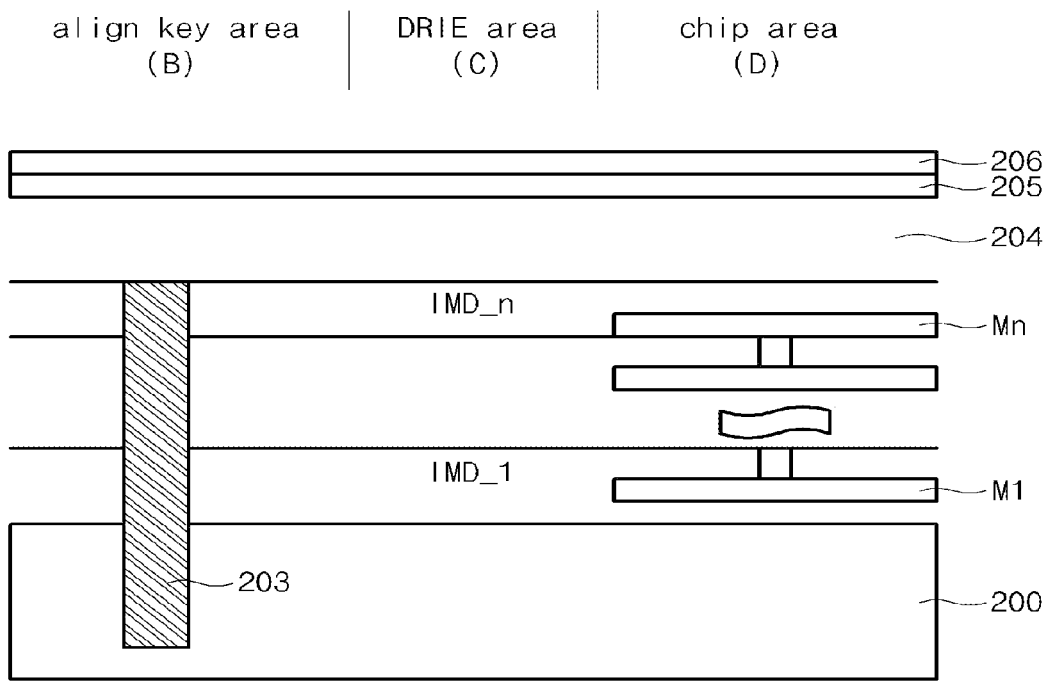
Figure 23:
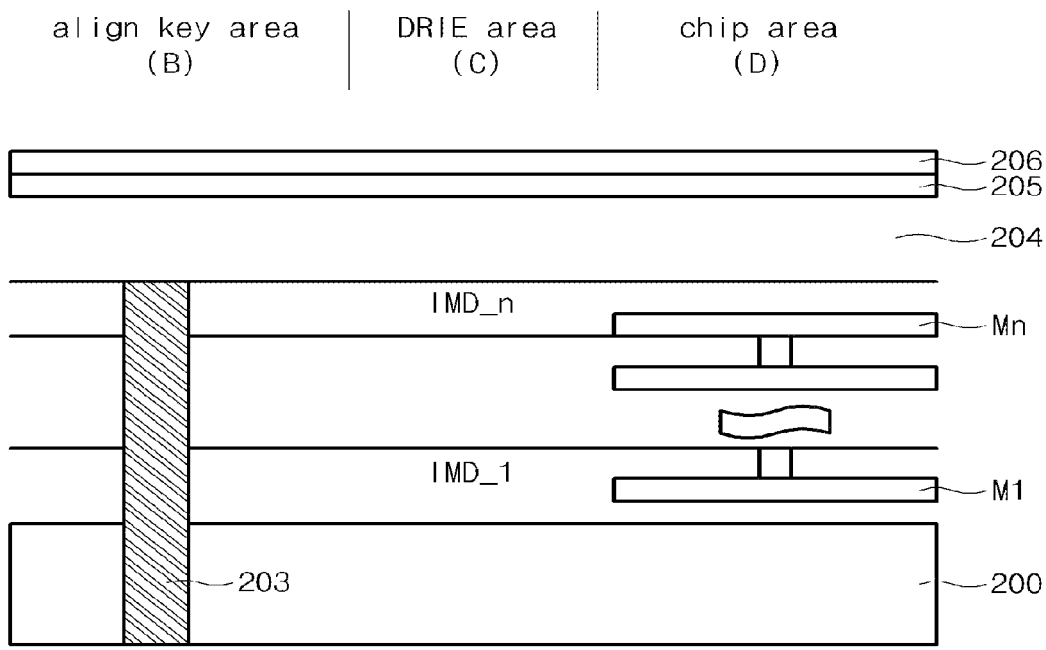

Thereafter, as shown in FIG. 22, a reinforcing film 206 is deposited on the coating film 205. The reinforcing film 206 serves as a physical support for protecting the wafer from an external physical stress. As a result, although the wafer receives a physical stress from the outside, the reinforcing film 206 prevents the wafer from being distorted.

In more detail, in order to reduce a wafer warpage encountered in the wafer back-grinding process, the reinforcing film 206 is additionally formed on the coating film 205.

The reinforcing film 206 may be formed of a heat-resistant polymer layer, a UV-cured polymer layer, an aluminum foil tape, and the like.

Next, with the wafer turned over, the back-grinding process is performed on the back side of the semiconductor substrate 200. The grinding process is performed until the align-key pattern 203 is exposed.

For example, the semiconductor substrate 200 is etched to have a thickness of about 200 μm~300 μm after the back-grinding process. The semiconductor substrate 200 may also have a thickness of about 150 μm. However, the thickness of the semiconductor substrate 200 is not limited only thereto, as long as the align-key pattern 203 is exposed on the back side of the substrate 200.

Figure 24:
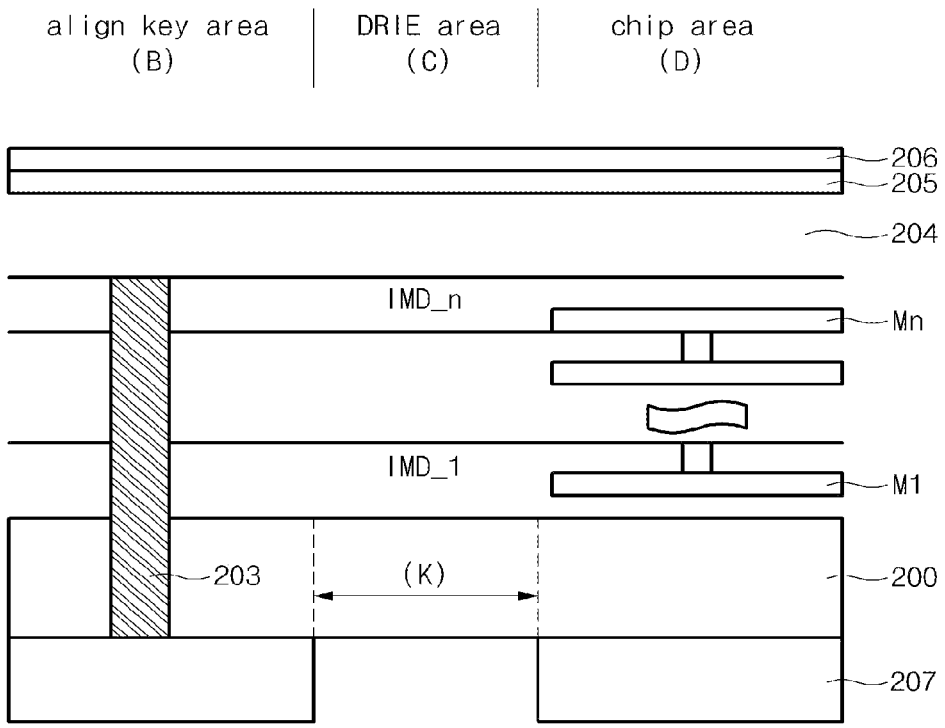

Subsequently, as shown in FIG. 24, a photo-mask process is performed onto the back side of the substrate 200. A photo-resist pattern 207 is formed on the back side of the semiconductor substrate 200. The photo-resist pattern defines the DRIE area C.

The align-key pattern 203 may be used as an align key for this photo-mask process onto the back side of the substrate 200.

In this case, the photoresist pattern 207 is formed covering the mask align key area B and the chip area D, but exposing the DRIE area C. The align-key pattern 203 is used as a reference key for etching the DRIE area C (i.e., K area).

Figure 25:
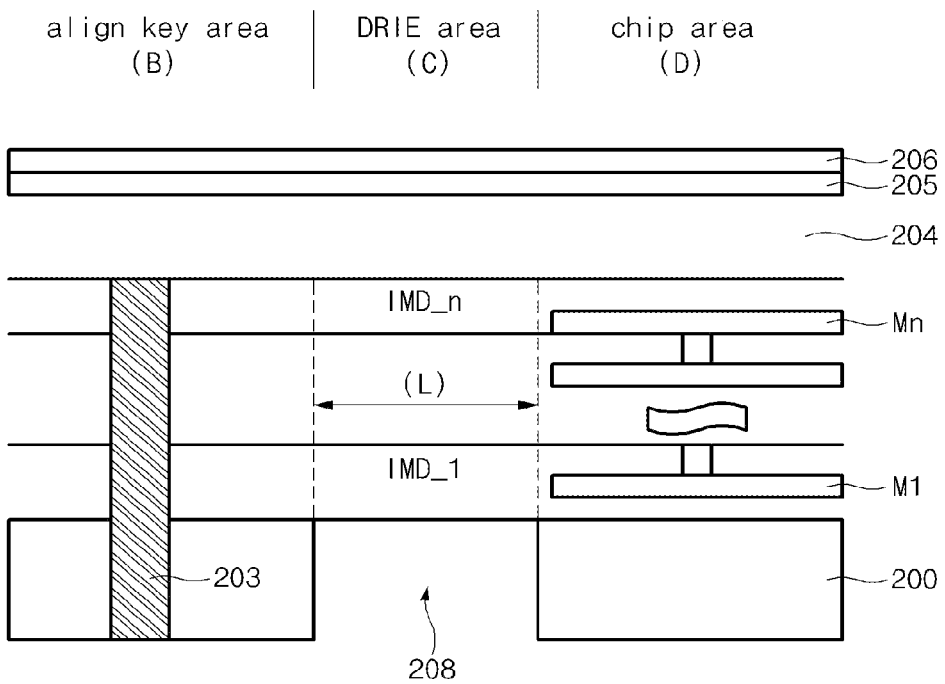

Thereafter, as shown in FIG. 25, the DRIE process is executed onto the back side of the semiconductor substrate 200 to form a second trench 208 which penetrates the semiconductor substrate 200. In other words, the K area is etched such that the trench area 208 for forming the scribe line L1 is formed. In this case, the trench area 208 may correspond to the scribe line L1 for separating each chip. The second trench 208 is formed as deep as such that neighboring chip areas are substantially isolated. For this purpose, the semiconductor substrate 200 in the DRIE area C can be completely removed or can be "substantially completely removed" so that chip areas D can be isolated from each other without no additional dicing process. Here, "substantially completely removed" means the substrate 200 in the DRIE area is removed by such an amount that the chip areas D can be separated from each other without an additional dicing process. Therefore, according to the present invention, a dicing process is performed by a DRIE process using the align-key pattern 203, rather than by a separate sawing process.

In accordance with the embodiment of the present invention, the second trench 208 is formed by etching the K area. However, the scope or spirit of the present invention is not limited only thereto, and the second trench 208 may be extended to the chip area D in which the IMD layers IMD_1~IMD_n are formed or to the align-key area B.

Figure 26:
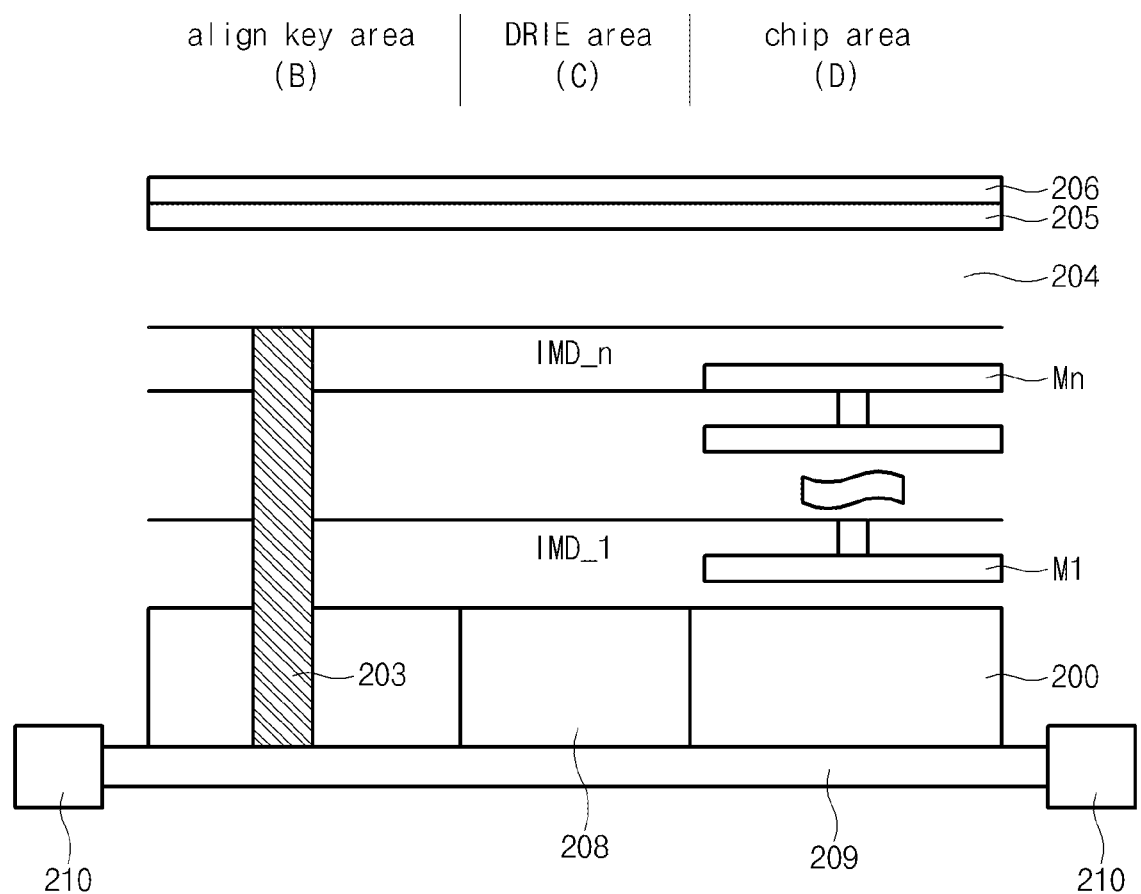

Next, as shown in FIG. 26, a wafer ring frame is formed on the back side of the semiconductor substrate 200. The wafer ring frame includes a donut-ring-shaped ring mount 210 and a ring film 209.

The ring film 209 is formed on the semiconductor substrate 200 such that the wafer is subject to a mounting process without causing damage onto the circuits formed over the wafer. A ring mount 210 is formed at both sides of the ring film 209.

The ring film 209 is used as a protection film for protecting chips over the wafer while the wafer is delivered. The ring film 209 is also used for making sure that the plurality of chip areas D keep their original locations without being disarranged during a packaging process. For this reason, the ring film 209 is detachably formed over the semiconductor substrate 200 so that the ring film 209 can be easily removed from the semiconductor substrate 200 when required.

The ring mount 210 for supporting the ring film 209 is formed around the ring film 209. In addition, the semiconductor substrate 200 including the second trench 208 is formed on the ring film 209. In this manner, the back side of the semiconductor substrate 200 is in contact with the ring film 209.

Figure 27:
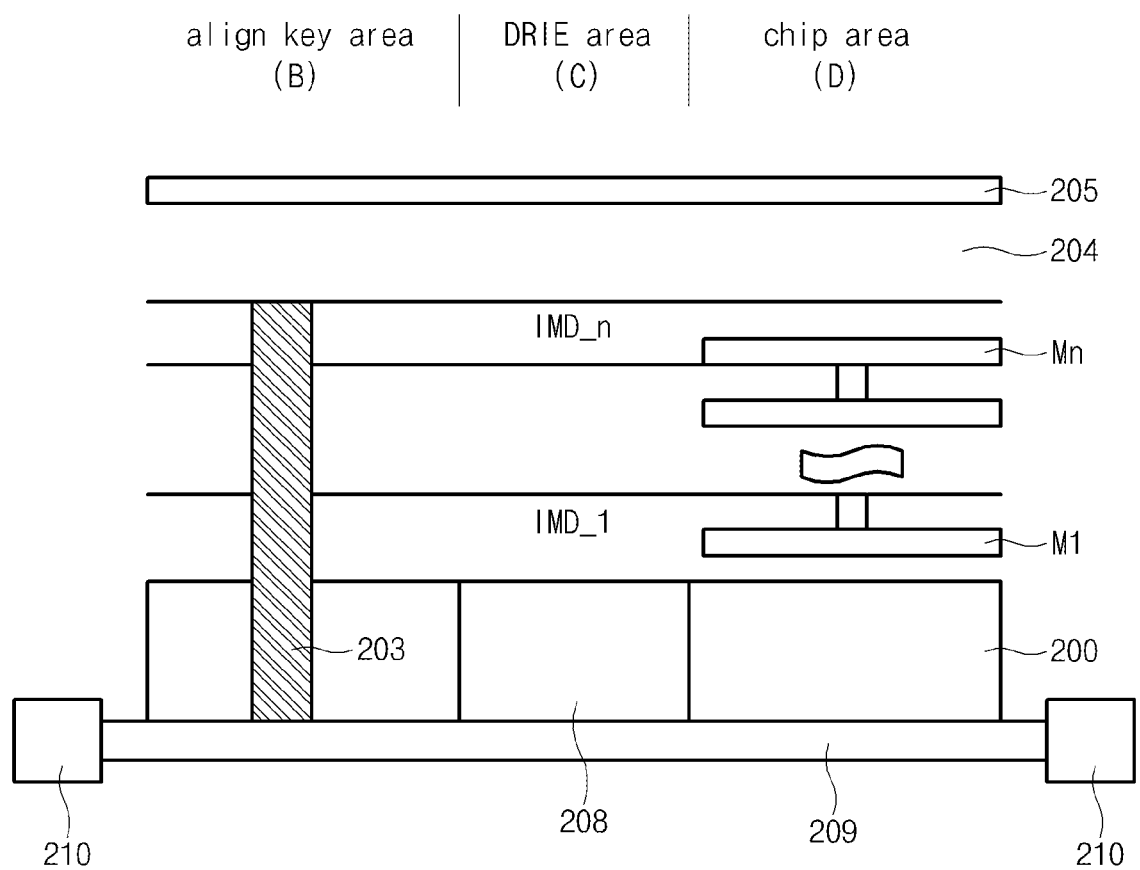
Figure 28:
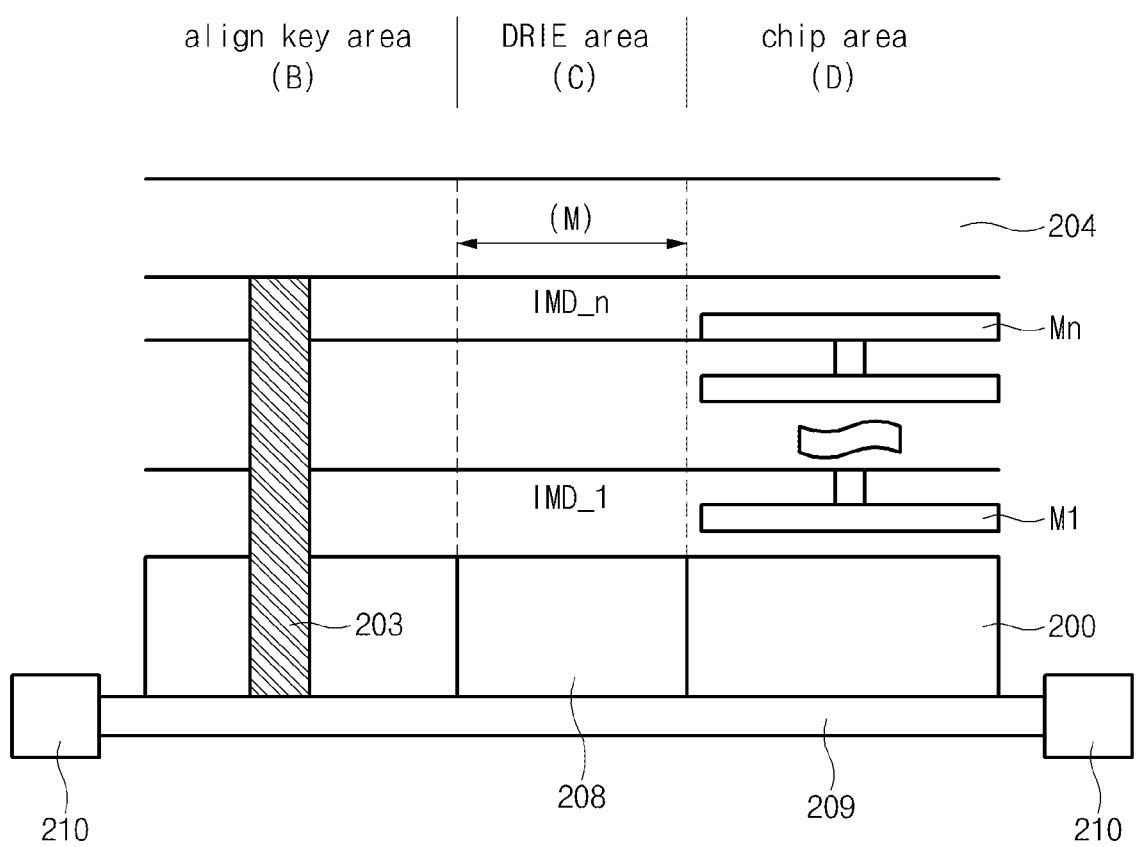

Thereafter, as shown in FIG. 27, the semiconductor substrate (200) is turned over again so that the front side faces up, and the reinforcing film 206 is removed. Then, as shown in FIG. 28, the coating film 205 formed on the passivation layer 204 is removed. As the result, the plurality of semiconductor chips are separated from each other. As mentioned above, according to the embodiment of the present invention, a dicing process is performed using the DRIE process without performing an additional wafer sawing process.

In this case, in the DRIE area C, a specific area M in which IMD layers IMD_1~IMD_n and the passivation layer 204 are formed is relatively thinner than the semiconductor substrate 200 such that the M area has a very thin thickness (i.e., a very small depth) as compared to the semiconductor substrate 200. In particular, the M area having a small thickness is considered in the same manner as in an etched status, such that it can be easily isolated.

For example, provided that the semiconductor substrate 200 has a thickness of about 200 μm~300 μm, the M area has a thickness of only about 3 μm. Therefore, the semiconductor substrate 200 of about 90% has already been isolated by the trench area 208, such that the M area can be easily isolated to make a distinction between chip areas.

Accordingly, if the scribe line L1 is cut by the trench area 208, the mask align key area B and the chip area D are separated from each other.

As apparent from the above description, the above-mentioned embodiments of the present invention have the following characteristics.

First, according to the present invention, memory chips can be diced using a DRIE process without performing an additional sawing process, resulting in a reduction in fabrication time and costs.

Second, according to the present invention, RFID chips can be diced using a DRIE process without performing an additional sawing process, resulting in a reduction in fabrication time and costs.

Third, according to the present invention, an area of a scribe line which is used to separate chips is decreased.

Fourth, according to the present invention, a scribe line can be easily defined using the align-key pattern (102, 203), and thus the area for a scribe-line can be reduced.

Fifth, according to the present invention, a DRIE process employed as a dicing process can be performed onto a plurality of DRIE areas (scribe line L1) at the same time, such that the fabrication time and costs required for a dicing process can be significantly reduced.

It should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A method comprising:
providing a semiconductor substrate having a plurality of chip areas, a plurality of scribe lines each disposed between adjacent chip areas, and an align key line disposed in a corresponding scribe line of the scribe lines;
forming an align key pattern in the align key line of the semiconductor substrate;
forming a circuit area on a corresponding chip area of the chip areas that is located at an upper part of the semiconductor substrate;
forming a passivation layer on the circuit area;
performing a backgrinding process at a back side of the semiconductor substrate until the align key pattern is exposed;
forming a first trench on the back side of the semiconductor substrate in the corresponding scribe line, using a photoresist pattern as an etch mask;
forming a ring film over the back side of the semiconductor substrate that includes the first trench; and
forming a ring mount around the ring film.

2. The method according to claim 1, wherein the chip areas include a plurality of radio frequency identification (RFID) chips.

3. The method according to claim 1, wherein the forming of the align key pattern includes:
forming a second trench on the semiconductor substrate; and
burying a filling material in the second trench.

4. The method according to claim 3, wherein the filling material is different in color from the semiconductor substrate.

5. The method according to claim 1, wherein the circuit area includes a metal line extending to the corresponding scribe line, and an Inter Metal Dielectric (IMD) layer.

6. The method according to claim 1, wherein the passivation layer is formed on the corresponding chip area and the corresponding scribe line that includes the align key line.

7. The method according to claim 1, further comprising:
forming a coating film over the passivation layer; and
forming a reinforcing film over the coating film.

8. The method according to claim 7, wherein the reinforcing film includes either of a polymer layer or an aluminum foil tape.

9. The method according to claim 1, wherein the photoresist pattern is formed on the corresponding chip area and the align key line of the semiconductor substrate.

10. The method according to claim 1, wherein the first trench is formed at the back side of the semiconductor substrate by a Deep Reactive Ion Etching (DRIE) process.

11. The method according to claim 5, wherein the first trench is formed until the IMD layer is exposed at the back side of the semiconductor substrate.

12. The method according to claim 7, further comprising:
after forming the ring mount, removing the coating film formed on the passivation layer, and removing the reinforcing film.

13. A method comprising:
providing a semiconductor substrate having a plurality of chip areas, a plurality of scribe lines each formed between adjacent chip areas, and an align key line disposed in a corresponding scribe line of the scribe lines;
forming a circuit area on a corresponding chip area of the chip areas that is located at an upper part of the semiconductor substrate;
forming an align key pattern in the align key line of the semiconductor substrate;
forming a passivation layer on the circuit area;
performing a backgrinding process at a back side of the semiconductor substrate until the align key pattern is exposed;
forming a first trench on the back side of the semiconductor substrate in the corresponding scribe line, using a photoresist pattern as an etch mask;
forming a ring film over the back side of the semiconductor substrate that includes the first trench; and
forming a ring mount along an outline of the ring film.

14. The method according to claim 13, wherein the forming of the align key pattern includes:
forming a second trench by etching an Inter Metal Dielectric (IMD) layer formed on the align key line;
forming a third trench coupled to the second trench by etching a portion of the semiconductor substrate in the align key line; and
burying a filling material in the second trench and the third trench.

15. The method according to claim 14, wherein the filling material is different in color from the semiconductor substrate.

16. The method according to claim 13, wherein the chip areas include a plurality of radio frequency identification (RFID) chips.

17. The method according to claim 13, wherein the passivation layer is formed on the corresponding chip area and the corresponding scribe line that includes the align key line.

18. The method according to claim 13, further comprising:
forming a coating film on the passivation layer; and
forming a reinforcing film on the coating film.

19. The method according to claim 13, wherein the photoresist pattern is formed on the corresponding chip area and the align key line of the semiconductor substrate.

20. The method according to claim 13, wherein the first trench is formed at the back side of the semiconductor substrate by a Deep Reactive Ion Etching (DRIE) process.

21. The method according to claim 18, further comprising:
removing the coating film formed on the passivation layer,
and removing the reinforcing film.

* * * * *